United States Patent
Imai

(10) Patent No.: US 9,159,792 B2
(45) Date of Patent: Oct. 13, 2015

(54) SIC SEMICONDUCTOR DEVICE AND METHOD FOR MANUFACTURING THE SAME

(71) Applicant: FUJI ELECTRIC CO., LTD., Kawasaki (JP)

(72) Inventor: Fumikazu Imai, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/456,391

(22) Filed: Aug. 11, 2014

(65) Prior Publication Data

US 2014/0346531 A1 Nov. 27, 2014

Related U.S. Application Data

(63) Continuation of application No. PCT/JP2013/054220, filed on Feb. 20, 2013.

(30) Foreign Application Priority Data

Feb. 20, 2012 (JP) ................................. 2012-033772

(51) Int. Cl.
| | |
|---|---|
| *H01L 29/47* | (2006.01) |
| *H01L 29/872* | (2006.01) |
| *H01L 29/16* | (2006.01) |
| *H01L 21/04* | (2006.01) |

(Continued)

(52) U.S. Cl.
CPC ........ *H01L 29/1608* (2013.01); *H01L 21/0485* (2013.01); *H01L 21/2855* (2013.01); *H01L 21/28518* (2013.01); *H01L 21/28537* (2013.01); *H01L 29/0619* (2013.01); *H01L 29/47* (2013.01); *H01L 29/66143* (2013.01); *H01L 29/872* (2013.01)

(58) Field of Classification Search
CPC ..................... H01L 21/2855; H01L 21/28518; H01L 21/28537; H01L 29/1608; H01L 29/66143; H01L 29/47; H01L 29/872
USPC .............................................. 257/77; 438/655
See application file for complete search history.

(56) References Cited

U.S. PATENT DOCUMENTS

| | | | | |
|---|---|---|---|---|
| 2006/0273323 A1* | 12/2006 | Yamamoto et al. | ............. | 257/77 |
| 2007/0138482 A1 | 6/2007 | Tanimoto | | |

(Continued)

FOREIGN PATENT DOCUMENTS

| | | |
|---|---|---|
| JP | 2000-208438 A | 7/2000 |
| JP | 2005-277240 A | 10/2005 |

(Continued)

*Primary Examiner* — Christine Enad
(74) *Attorney, Agent, or Firm* — Rabin & Berdo, P.C.

(57) ABSTRACT

In a method which heats a layer including nickel and titanium on a SiC substrate (1) to form a nickel silicide layer (4) including titanium carbide, the layer including nickel and titanium is formed by vapor deposition or sputtering. The nickel silicide layer (4) is heated at a temperature that is equal to or higher than 1100° C. and equal to or less than 1350° C. to generate the layer including nickel and titanium. At that time, the rate of temperature increase is equal to greater than 10° C./minute and equal to or less than 1350° C./minute and a heating duration is equal to or more than 0 minute and equal to or less than 120 minutes. These heating conditions make it possible to obtain a homogeneous rear surface electrode (8) for a SiC semiconductor device which has sufficiently low rear surface contact resistance.

9 Claims, 8 Drawing Sheets

(51) Int. Cl.
  *H01L 29/66* (2006.01)
  *H01L 29/06* (2006.01)
  *H01L 21/285* (2006.01)

(56) References Cited

U.S. PATENT DOCUMENTS

2010/0207125 A1* 8/2010 Uchida et al. .................. 257/77
2011/0227096 A1* 9/2011 Wada et al. .................... 257/77
2014/0061674 A1 3/2014 Imai

FOREIGN PATENT DOCUMENTS

| | | |
|---|---|---|
| JP | 2006-332358 A | 12/2006 |
| JP | 2006-344688 A | 12/2006 |
| JP | 2007-184571 A | 7/2007 |
| JP | 2008-135611 A | 6/2008 |
| JP | 2010-086999 A | 4/2010 |
| JP | 2011-176183 A | 9/2011 |
| WO | WO-2009/054140 A1 | 4/2009 |
| WO | WO-2012/165513 A1 | 12/2012 |

* cited by examiner

SIC SEMICONDUCTOR DEVICE AND METHOD FOR MANUFACTURING THE SAME

CROSS-REFERENCE TO RELATED APPLICATIONS

This is a bypass continuation of International Application number PCT/P2013/054220, which was filed on Feb. 20, 2013 and designated the United States. Furthermore, this application claims the benefit of foreign priority of Japanese application number 2012-033772, filed on Feb. 20, 2012. The disclosures of both of these earlier applications are incorporated herein by reference.

TECHNICAL FIELD

The present invention relates to a SiC semiconductor device manufacturing method and SiC semiconductor device manufactured by the manufacturing method. In particular, the invention relates to a method for forming a homogenous rear surface electrode.

BACKGROUND ART

In a semiconductor device which has been used as a power device, silicon has been mainly used as the semiconductor material. Silicon carbide (SiC), which is a semiconductor with a wider band gap than silicon, has good physical properties, such as thermal conductivity that is three times more than silicon, a maximum electric field intensity that is ten times more than silicon, and an electron drift speed that is two times more than silicon. In recent years, various institutes have conducted active research on applications of a power device which has a high dielectric breakdown voltage and low loss and can operate at a high temperature. A vertical semiconductor device including a rear surface electrode which has a low-resistance ohmic electrode on the rear surface side has been mainly used as the structure of the power device. Various materials and structures have been used for the rear surface electrode. As one of the materials and structures, for example, a laminate of a titanium layer, a nickel layer, and a silver layer (for example, see the following Patent Document 1) or a laminate of a titanium layer, a nickel layer, and a gold layer (for example, see the following Patent Document 2) has been proposed.

In a vertical semiconductor device using SiC which is typified by a Schottky barrier diode, a method has been used which forms a nickel layer on a SiC substrate, heats the nickel layer to form a nickel silicide layer, and forms an ohmic contact between the SiC substrate and the nickel silicide layer (for example, see the following Patent Documents 1 and 2).

As a method of forming the ohmic electrode, a method has been proposed which forms a laminate of a plurality of metal (Ni, Ti, and Al) layers on a SiC substrate and heats the laminate at a temperature of 700° C. to 1100° C. In the method, ohmic characteristics are obtained at, most preferably, a temperature of 800° C. (for example, see the following Patent Document 3). In addition, a technique has been proposed which radiates a laser beam to the rear surface of a SiC substrate to form an ohmic electrode in a low-temperature process (for example, see the following Patent Document 4).

CITATION LIST

Patent Document

Patent Document 1: JP 2007-184571 A
Patent Document 2: JP 2010-86999 A
Patent Document 3: JP 2005-277240 A
Patent Document 4: JP 2008-135611 A

DISCLOSURE OF THE INVENTION

Problem to be Solved by the Invention

However, the ohmic electrode obtained by the technique according to the related art, such as the above-mentioned Patent Document 3 or the above-mentioned Patent Document 4, has the problems that a variation in contact resistance is large and excellent forward voltage (Vf) characteristics are not obtained.

In the method for manufacturing the rear surface electrode for a SiC semiconductor device disclosed in the above-mentioned Patent Document 4, after the nickel layer is formed on the SiC substrate, a laser beam with an intensity of 0.9 J/cm$^2$ is radiated by a KrF excimer laser (248 nm) to form the nickel silicide layer and the ohmic contact is formed between the SiC substrate and the nickel silicide layer.

As disclosed in the above-mentioned Patent Document 1, nickel silicide is generated by a solid-phase reaction indicated by a reaction formula represented by the following Expression (1).

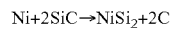
[Expression (1)]

For example, in the above-mentioned Patent Document 1, in the method which forms the nickel layer on the SiC substrate and heats the nickel layer to form the nickel silicide layer, thereby forming the ohmic contact between the SiC substrate and the nickel silicide layer, the heating process is rapidly performed in an Ar gas atmosphere at a temperature of 1000° C. for two minutes.

However, when the solid-phase reaction indicated by the reaction formula represented by the above-mentioned Expression (1) is not uniformly performed, a variation in ohmic contact resistance occurs, which makes it difficult to obtain excellent Vf characteristics of the manufactured SiC semiconductor device.

The invention has been made in order to solve the above-mentioned problems and an object of the invention is to provide a new SiC semiconductor device manufacturing method which heats a layer including nickel and titanium to form a homogeneous nickel silicide layer including titanium carbide and a homogeneous SiC semiconductor device in which the rear surface contact resistance of a rear surface electrode structure is sufficiently low.

Means for Solving Problem

In order to achieve the above-mentioned object, the invention has the following characteristics.

A method for manufacturing a semiconductor device according to an aspect of the invention includes forming an electrode structure on a SiC semiconductor. In the forming of the electrode structure on the SiC semiconductor, a layer including nickel and titanium is formed on the SiC semiconductor and is heated to generate a nickel silicide layer including titanium carbide and a metal layer is formed on the nickel silicide layer including titanium carbide. The heating may be performed at a temperature that is equal to or higher than 1100° C. and equal to or lower than 1350° C. In the heating, a rate of temperature increase may be equal to or greater than 10° C./minute and equal to or less than 1350° C./minute and a heating duration may be equal to or more than 0 minute and equal to or less than 120 minutes.

The semiconductor device may have, as the electrode structure, a rear surface electrode structure including an ohmic electrode, which is the nickel silicide layer including titanium carbide, and a rear surface electrode, which is the metal layer, and a front surface electrode structure including a Schottky electrode and a front surface electrode. The electrode structure may include the nickel silicide layer including titanium carbide, a titanium layer, a nickel layer, and a gold layer which are formed on the SiC semiconductor in this order from a side close to the SiC semiconductor. In addition, the nickel silicide layer including titanium carbide may include a nickel silicide layer and a titanium carbide layer which are laminated in this order from a side close to the SiC semiconductor.

According to another aspect of the invention, there is provided a semiconductor device having the electrode structure formed by the above-mentioned manufacturing method.

Effect of the Invention

According to the manufacturing method of the invention, it is possible to obtain a homogeneous rear surface electrode for a SiC semiconductor device which has sufficiently low rear surface contact resistance. Specifically, the layer including titanium and nickel is formed on the SiC semiconductor and is then heated to form the nickel silicide layer including titanium carbide. Therefore, it is possible to obtain a rear surface electrode for a SiC semiconductor device which has sufficiently low rear surface contact resistance and a small variation. Since the variation is small, high yield is obtained. In addition, when the heating is performed under predetermined conditions, it is possible to reduce rear surface contact resistance and a variation in the rear surface contact resistance.

BEST MODE(S) FOR CARRYING OUT THE INVENTION

Figure 1:
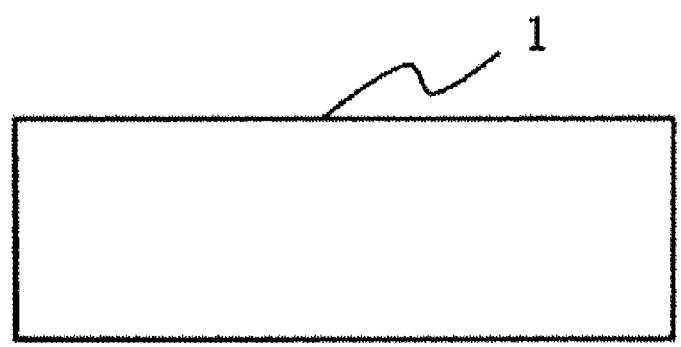
FIG. 1 is a cross-sectional view illustrating a SiC substrate in a method for manufacturing a Schottky bather diode according to an embodiment of the invention.

Hereinafter, an embodiment of the invention will be described.

In the invention, in the formation of an electrode on a SiC semiconductor, a layer including titanium (Ti) and nickel (Ni) is formed and is then heated to form a nickel silicide (NiSi) layer including titanium carbide (TiC), instead of the method of forming the nickel (Ni) layer according to the related art. The layer including titanium and nickel can be formed on the SiC semiconductor by laminating, for example, a nickel layer and a titanium layer in this order and heating the layers to form the nickel silicide layer including titanium carbide. In this case, since titanium carbide is generated, it is possible to prevent the precipitation of carbon.

In the invention, heating for forming the nickel silicide layer is performed under specific conditions to obtain a homogeneous rear surface electrode structure with sufficiently low rear surface contact resistance.

Before a metal film, which will be a rear surface electrode, is formed, a carbon layer, which is precipitated on the surface through various processing steps (for example, a step of forming a Schottky electrode) that are performed after the nickel silicide layer including titanium carbide is formed, is removed by, for example, reverse sputtering. Therefore, it is possible to prevent the metal film, which will be the rear surface electrode, from peeling off.

In the invention, a metal layer is formed on the nickel silicide layer including titanium carbide. For convenience, the nickel silicide layer including titanium carbide is referred to as an ohmic electrode, the metal layer formed on the nickel silicide layer is referred to as a rear surface electrode, and a structure including the ohmic electrode and the rear surface electrode is referred to as a rear surface electrode structure. A front surface electrode including a Schottky electrode which is provided so as to come into contact with a SiC substrate and a metal layer which is formed on the Schottky electrode is formed on the front surface of the SiC substrate which is opposite to the rear surface electrode structure. A structure including the Schottky electrode and the front surface electrode is referred to as a front surface electrode structure.

As a preferred embodiment of a SiC semiconductor device according to the invention, a Schottky barrier diode will be described with reference to FIGS. 1 to 7. FIGS. 1 to 7 are diagrams illustrating a method for manufacturing the Schottky barrier diode and schematically illustrate the cross-section of the Schottky barrier diode which is being manufactured. FIG. 7 illustrates the structure of the Schottky barrier diode manufactured by this embodiment. The Schottky barrier diode using the SiC semiconductor includes a SiC substrate 1, a guard ring 2, an insulating layer 3, a nickel silicide layer 4 including titanium carbide, a Schottky electrode 6, a front surface electrode 7, and a rear surface electrode 8.

FIG. 1 is a cross-sectional view illustrating the SiC substrate in the method of manufacturing the Schottky barrier diode according to the embodiment of the invention. The SiC substrate 1 includes a wafer layer made of SiC and an epitaxial layer made of SiC. A boundary line between the wafer layer and the epitaxial layer is not illustrated. An epitaxiallayer-side surface of the SiC substrate 1 is a front surface and a wafer-layer-side surface thereof is a rear surface.

Figure 2:
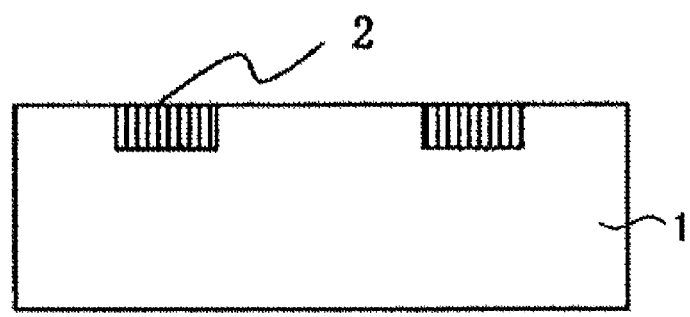
FIG. 2 is a cross-sectional view illustrating a step of forming a guard ring in the method for manufacturing the Schottky barrier diode according to the embodiment of the invention.

FIG. 2 is a cross-sectional view illustrating a step of forming a guard ring in the method of manufacturing the Schottky barrier diode according to the embodiment of the invention. As illustrated in FIG. 2, ion implantation is performed on a portion of the epitaxial layer of the SiC substrate 1 to selectively form the guard ring 2 in a surface layer of the front surface of the SiC substrate 1.

Figure 3:
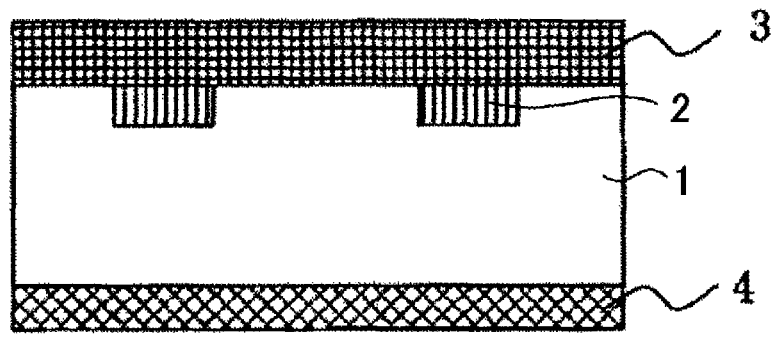
FIG. 3 is a cross-sectional view illustrating a step of forming an insulating layer and a nickel silicide layer in the method for manufacturing the Schottky barrier diode according to the embodiment of the invention.

FIG. 3 is a cross-sectional view illustrating a step of forming the insulating layer and the nickel silicide layer in the method of manufacturing the Schottky barrier diode according to the embodiment of the invention. The insulating layer 3, which is an oxide film (for example, $SiO_2$), is formed on the front surface of the SiC substrate 1 so as to cover the guard ring 2. Then, a layer including nickel and titanium is formed on the rear surface of the SiC substrate 1 and is then heated to form an ohmic electrode which is the nickel silicide layer 4 including titanium carbide.

It is preferable that, as the layer including nickel and titanium, a nickel layer and a titanium layer be sequentially formed on the SiC substrate 1. The ratio of nickel to titanium can be set such that the ratio of the thickness of the nickel layer to the thickness of the titanium layer is 1:1 to 10:1, preferably, 3:1 to 6:1 when the nickel layer and the titanium layer are laminated in this order. At that time, it is preferable that the thickness of the nickel layer be in the range of 20 nm to 100 nm and the thickness of the titanium layer be in the range of 10 nm to 50 nm. In addition, an alloy layer may be formed such that titanium is included in nickel. In this case, similarly, the ratio of nickel to titanium can be 1:1 to 10:1, preferably, 3:1 to 6:1. When the layer including nickel and titanium is heated at a temperature that is equal to or higher than 1050° C. and equal to or lower than 1350° C., titanium carbide is generated by reaction with the SiC substrate 1 and the nickel silicide layer 4 including titanium carbide is obtained.

The nickel layer and the titanium layer can be formed by a thin film forming method, such as vapor deposition or sputtering. After the thin film is formed, heating is performed under the conditions of an inert gas atmosphere, such as an argon (Ar) atmosphere, a pressure of 0.1 Pa to 1.013 MPa, preferably, 0.1 MPa to 0.2 MPa, and a gas flow rate of 100 cc/minute to 10000 cc/minute, preferably, 500 cc/minute to 3000 cc/minute to obtain the nickel silicide layer 4 including titanium carbide. In the heating process, a heating furnace is used, the rate of temperature increase is in the range of 10° C./minute to 1350° C./minute, preferably, 10° C./minute to 100° C./minute, the attainable temperature is in the range of 1100° C. to 1350° C., desirably, 1150° C. (preferably, 1200° C.) to 1350° C., and heating duration is in the range of 0 minute to 120 minutes, preferably, 2 minutes to 30 minutes.

As in the embodiment, as the measurement result of the sheet resistance of the ohmic electrode, a resistance value is small at an attainable temperature of 1100° C. or more and a variation is also small. When the rate of temperature increase, the attainable temperature, and the heating duration are within the above-mentioned ranges, rear surface contact resistance is sufficiently reduced and is less than a sheet resistance of 0.7 Ω/. In addition, the rear surface contact resistance is uniform and yield is high. Preferably, an element which has a sheet resistance of 0.4 Ω/ or less and a small variation is obtained. When the rate of temperature increase is less than 10° C./minute, productivity is significantly reduced, which is not preferable. On the other hand, when the rate of temperature increase is greater than 1350° C./minute, a defect, such as breakdown, occurs due to the thermal shock of a member used in a heating device. When the rate of temperature increase is equal to or greater than 10° C./minute and equal to or less than 100° C./minute, productivity is ensured and the above-mentioned defect does not occur. The effect is more remarkable. When the attainable temperature is lower than 1050° C., the generation of the nickel silicide layer is insufficient. When the attainable temperature is higher than 1350° C., it is higher than the heat resistance temperature of the member used in the heating device, which is likely to result in a defect in the device. The upper limit of the heating temperature is limited by the heat resistance temperature of the device. When the attainable temperature is equal to or higher than 1200° C. and equal to or less than 1350° C., the result becomes more remarkable. The heating duration may be 0 minute. When the heating is maintained and the heating duration is longer than 120 minutes, there is a concern that productivity will be significantly reduced and the device will be overheated. It is preferable that the heating duration be equal to or more than 2 minutes and equal to or less than 30 minutes, from the above-mentioned viewpoint.

The thickness of the formed nickel silicide layer 4 including titanium carbide is in the range of 10 nm to 100 nm, preferably, in the range of 20 nm to 30 nm.

Since titanium carbide has high adhesion to titanium in the rear surface electrode laminate formed on the ohmic electrode, it has a function of preventing the rear surface electrode from peeling off.

Figure 4:
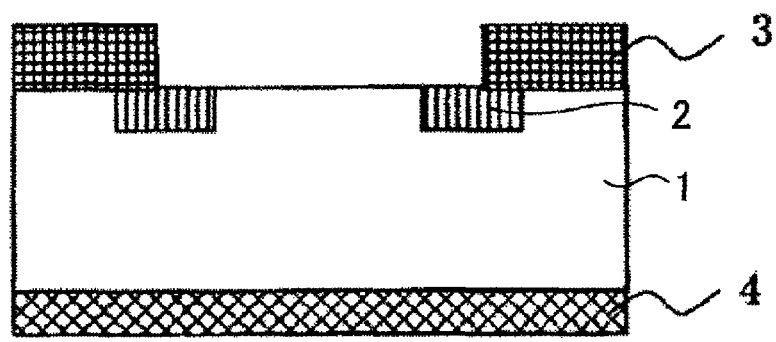
FIG. 4 is a cross-sectional view illustrating a step of forming a contact hole in the method for manufacturing the Schottky barrier diode according to the embodiment of the invention.
Figure 5:
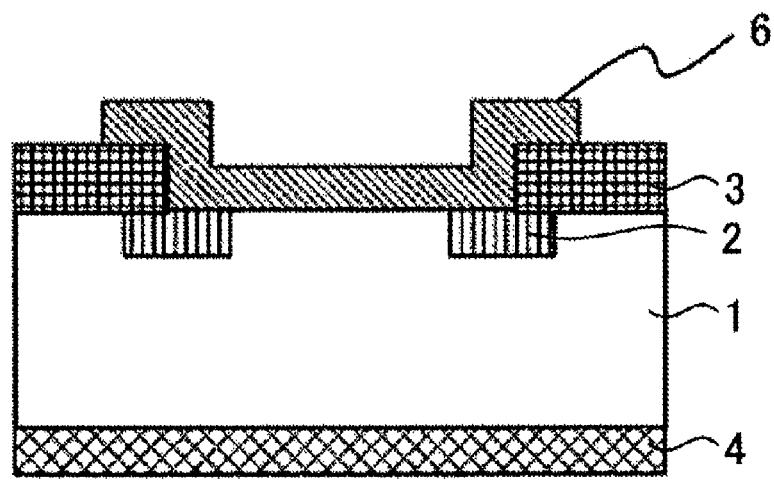
FIG. 5 is a cross-sectional view illustrating a step of forming a Schottky electrode in the method for manufacturing the Schottky barrier diode according to the embodiment of the invention.

FIG. 4 is a cross-sectional view illustrating a step of forming a contact hole in the method of manufacturing the Schottky barrier diode according to the embodiment of the invention. FIG. 5 is a cross-sectional view illustrating a step of forming the Schottky electrode in the method of manufacturing the Schottky bather diode according to the embodiment of the invention. As illustrated in FIG. 5, for example, a titanium layer is formed as the Schottky electrode 6 on the portion which is exposed by etching and is then heated to form a Schottky contact. The heating temperature is in the range of about 400° C. to 600° C. The heating process is performed in an argon or helium atmosphere.

Figure 6:
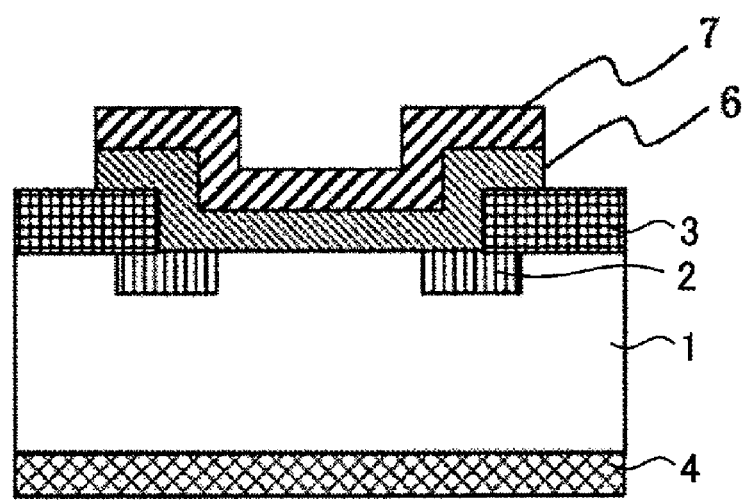
FIG. 6 is a cross-sectional view illustrating a step of forming a front surface electrode in the method for manufacturing the Schottky barrier diode according to the embodiment of the invention.
Figure 7:
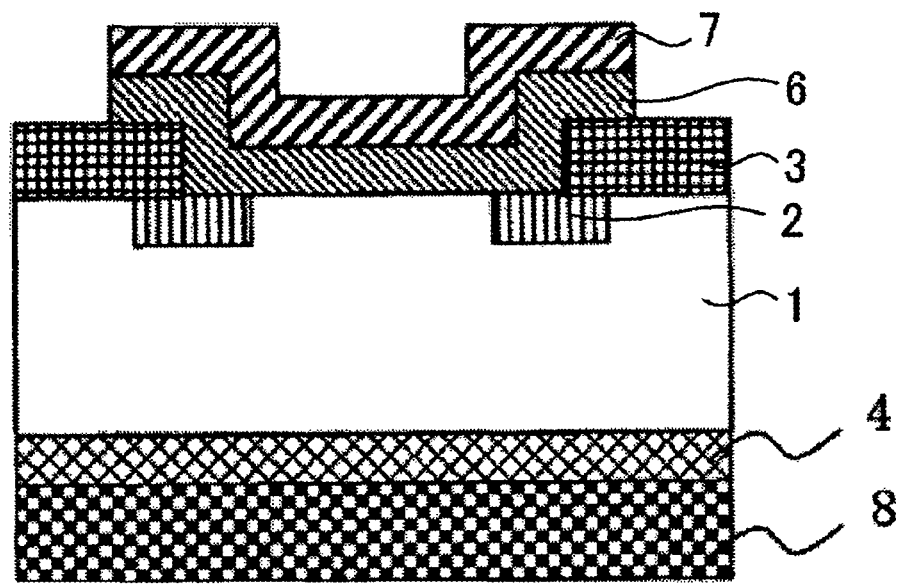
FIG. 7 is a cross-sectional view illustrating a step of forming a rear surface electrode in the method for manufacturing the Schottky barrier diode according to the embodiment of the invention.

FIG. 6 is a cross-sectional view illustrating a step of forming the front surface electrode in the method of manufacturing the Schottky bather diode according to the embodiment of the invention. As illustrated in FIG. 6, the Schottky electrode 6 is covered with aluminum. Therefore, the front surface electrode 7 is formed.

FIG. 7 is a cross-sectional view illustrating a step of forming the rear surface electrode in the method of manufacturing the Schottky bather diode according to the embodiment of the invention. As illustrated in FIG. 7, the rear surface electrode 8 obtained by sequentially laminating titanium, nickel, and gold is formed on the nickel silicide layer 4 including titanium carbide from which the carbon layer is removed.

The SiC substrate 1 subjected to all deposition processes is diced into SiC Schottky barrier diode chips. The Schottky bather diode has been described above. However, the SiC semiconductor device according to the invention is not limited to the Schottky barrier diode, but the invention can be applied to various semiconductor devices using SiC, such as MOSFETs.

EXAMPLE 1

Figure 8:
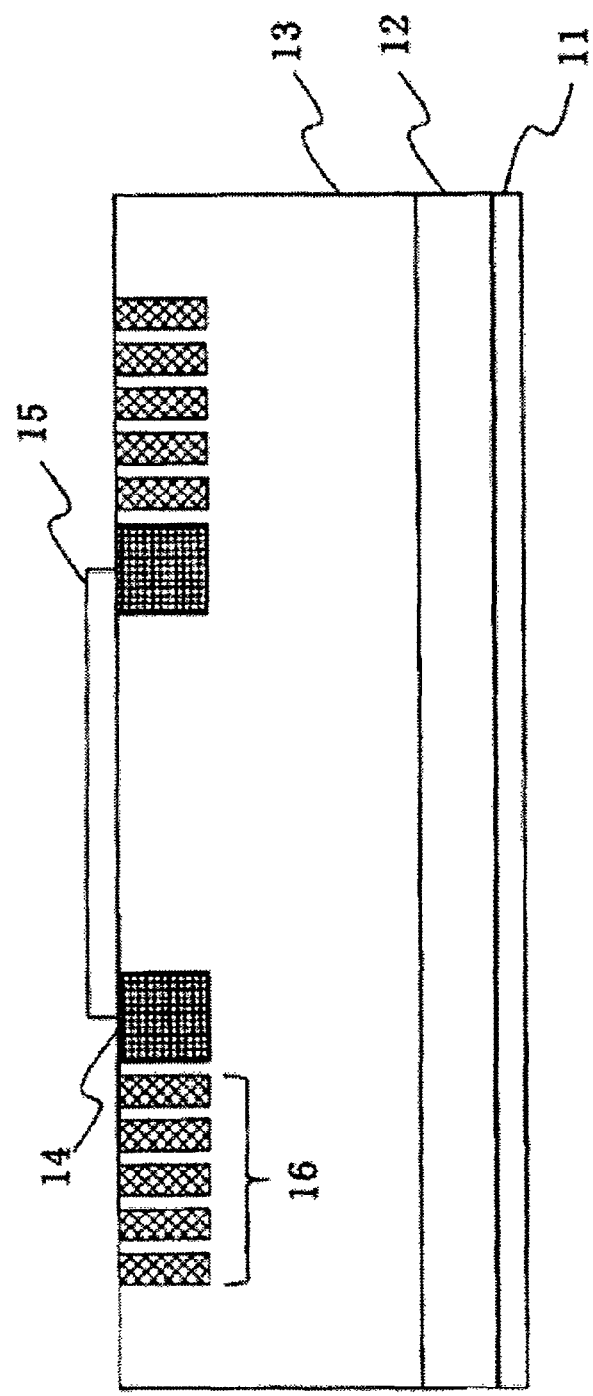
FIG. 8 is a cross-sectional view illustrating an SBD with a floating limiting ring (FLR) structure.

Examples of the invention will be described below with reference to FIG. 8. FIG. 8 is a cross-sectional view illustrating a Schottky barrier diode (SBD) with a floating limiting ring (FLR) structure.

An n-type region (not illustrated) for a channel stopper, a p-type region (p-type impurity ion implantation region 14) for a termination structure, and a p-type region for an FLR structure 16 were formed in a surface layer of the front surface (close to a low-concentration n-type drift layer 13) of the SiC substrate (high-concentration n-type substrate 12), on which the epitaxial layer (low-concentration n-type drift layer 13) is formed, by ion implantation. Then, phosphorus (P) which was implanted in order to form the n-type region for the channel stopper and aluminum (Al) which was implanted in order to form the p-type region for the termination structure and the p-type region for the FLR structure 16 were activated in an argon atmosphere at a temperature of 1620° C. for 180 seconds. Then, a $SiO_2$ film (not illustrated) with a thickness of 500 nm was formed on the front surface of the substrate by atmospheric pressure CVD. Then, a titanium layer with a thickness of 20 nm and a nickel layer with a thickness of 60 nm were formed on the rear surface of the substrate (close to a high-concentration n-type substrate 12) by a sputtering device. A nickel layer with a thickness of 60 nm and a titanium layer with a thickness of 20 nm were sequentially formed on the rear surface of the substrate. The substrate having the nickel layer and the titanium layer formed thereon was heated by a high-speed annealing device (RTA) including an infrared lamp under the conditions of an argon atmosphere, a rate of temperature increase of 20° C./minute, an attainable temperature of 1100° C., and a heating duration of 2 minutes. Silicon atoms in the SiC substrate react with nickel by the heating process and nickel silicide is generated. As a result, it is possible to obtain an ohmic contact. In addition, carbon atoms in the SiC substrate react with titanium and titanium carbide is generated and is precipitated on the surface of the nickel silicide. In this way, an ohmic electrode 11 is formed from the nickel silicide layer including titanium carbide.

Then, a contact hole was formed in the oxide film ($SiO_2$ film) on the front surface of the substrate using a hydrofluoric acid buffer solution (see FIG. 4). Then, a titanium film for the Schottky electrode 15 was formed with a thickness of 200 nm by a sputtering device and was then processed by RTA in an argon atmosphere at a temperature of 500° C. for 5 minutes.

Then, a titanium film with a thickness of 70 nm, a nickel film with a thickness of 700 nm, and a gold film with a thickness of 200 nm were continuously formed on the nickel silicide layer (ohmic electrode 11) including titanium carbide by a vapor deposition device to form the rear surface electrode (not illustrated). For example, silver (Ag), aluminum, or copper (Cu) can be used as the rear surface electrode material in this example. The rear surface electrode may have a single-layer structure or a two-layer structure. In addition, the rear surface electrode may be formed by, for example, a sputtering method or a plating method.

The substrate obtained by the above-mentioned manufacturing method was diced into chips and the electrical characteristics of the chip were evaluated. As a result, a SiC Schottky bather diode which had an on-voltage (Vf) of 1.39 V±0.045 V at room temperature was obtained. Here, ±0.045 V indicates the degree of variation of a plurality of elements.

EXAMPLE 2

In Example 2, when a layer including titanium and nickel was formed on a SiC semiconductor and a nickel silicide layer including titanium carbide was formed by heating, a plurality of heating conditions were set and examined. Ohmic electrodes were manufactured by a high-speed annealing device (RTA) including an infrared lamp in an argon atmosphere at a rate of temperature increase of 10° C./minute under different heating temperature conditions and the sheet resistance of the ohmic electrodes was measured. The heating duration was 30 minutes. The measurement results are illustrated in Table 1.

TABLE 1

| Heating temperature (° C.) | Sheet resistance (Ω/) | Variation |
| --- | --- | --- |
| 1000 | 0.75 | 0.15 |
| 1050 | 0.57 | 0.14 |
| 1100 | 0.42 | 0.07 |
| 1150 | 0.39 | 0.06 |
| 1200 | 0.37 | 0.05 |
| 1250 | 0.36 | 0.04 |
| 1300 | 0.35 | 0.039 |
| 1350 | 0.35 | 0.038 |
| 1400 | 0.35 | 0.037 |
| 1450 | 0.35 | 0.036 |
| 1500 | 0.35 | 0.035 |

Figure 9:
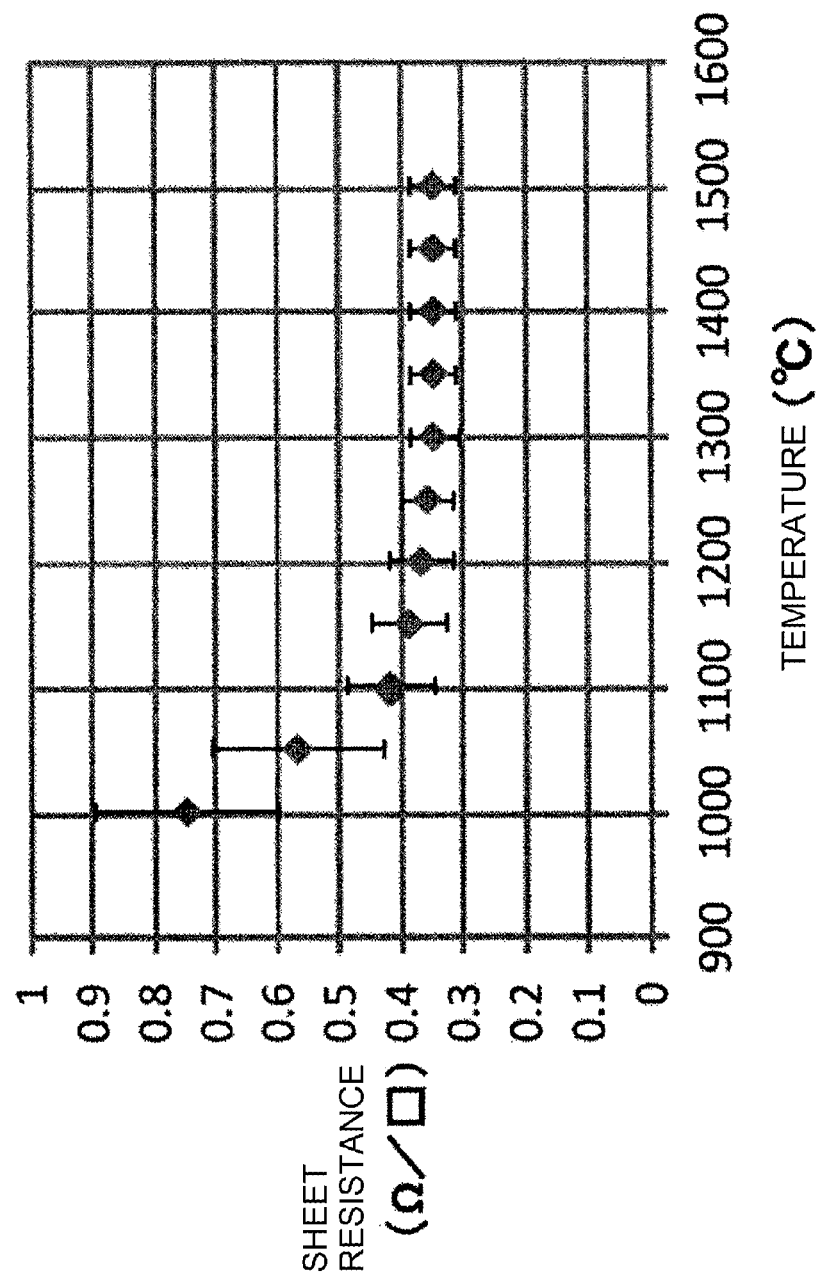
FIG. 9 is a diagram illustrating the sheet resistance of an ohmic electrode and a heating temperature in the invention.

The relationship between the heating temperature and the sheet resistance of the ohmic electrodes illustrated in Table 1 is illustrated in FIG. 9. FIG. 9 is a diagram illustrating the relationship between the heating temperature and the sheet resistance of the ohmic electrodes according to the invention. In FIG. 9, the length of a vertical bar indicates a variation in the sheet resistance. It is confirmed that, as the heating temperature increases, the resistance value is reduced and the variation tended to be reduced. At a heating temperature of 1100° C. or more, a resistance value and a variation in the resistance value are substantially constant. As can be seen from Table 1, at a heating temperature of 1050° C. or more, the sheet resistance is equal to or less than 0.57 Ω/ and the variation in the sheet resistance is equal to or less than 0.14 and is less than that at a heating temperature of 1000° C. At a heating temperature of 1100° C. or more, the sheet resistance is reduced to 0.42 Ω/ or less and the variation in the sheet resistance is reduced to 0.14 or less. At a heating temperature of 1150° C. or more, the sheet resistance is further reduced to 0.39 Ω/ or less and the variation in the sheet resistance is further reduced to 0.06 or less. At a heating temperature of 1200° C. or more, the sheet resistance is further reduced to 0.37 Ω/ or less and the variation in the sheet resistance is further reduced to 0.05. When the heating temperature is higher than 1350° C., the sheet resistance and the variation in the sheet resistance are reduced, but the effect of the reduction is not particularly improved.

Next, samples were manufactured at different rates of temperature increase of 50° C./minute and 100° C./minute and the sheet resistance of the ohmic electrodes was measured. The measurement results were substantially equal to those illustrated in FIG. 9.

Next, a plurality of ohmic electrodes were measured at a rate of temperature increase of 10° C./minute at a heating temperature of 1100° C. for different heating durations and the sheet resistance of the ohmic electrodes was measured. The measurement results are illustrated in Table 2.

TABLE 2

| Heating duration (minutes) | Sheet resistance (Ω/) | Variation |
| --- | --- | --- |
| 0 | 0.7 | 0.15 |
| 1 | 0.66 | 0.14 |
| 2 | 0.62 | 0.13 |
| 5 | 0.57 | 0.12 |
| 10 | 0.5 | 0.08 |

TABLE 2-continued

| Heating duration (minutes) | Sheet resistance (Ω/) | Variation |
|---|---|---|
| 20 | 0.41 | 0.05 |
| 30 | 0.36 | 0.039 |
| 40 | 0.35 | 0.038 |
| 50 | 0.35 | 0.037 |
| 60 | 0.35 | 0.036 |

Figure 10:
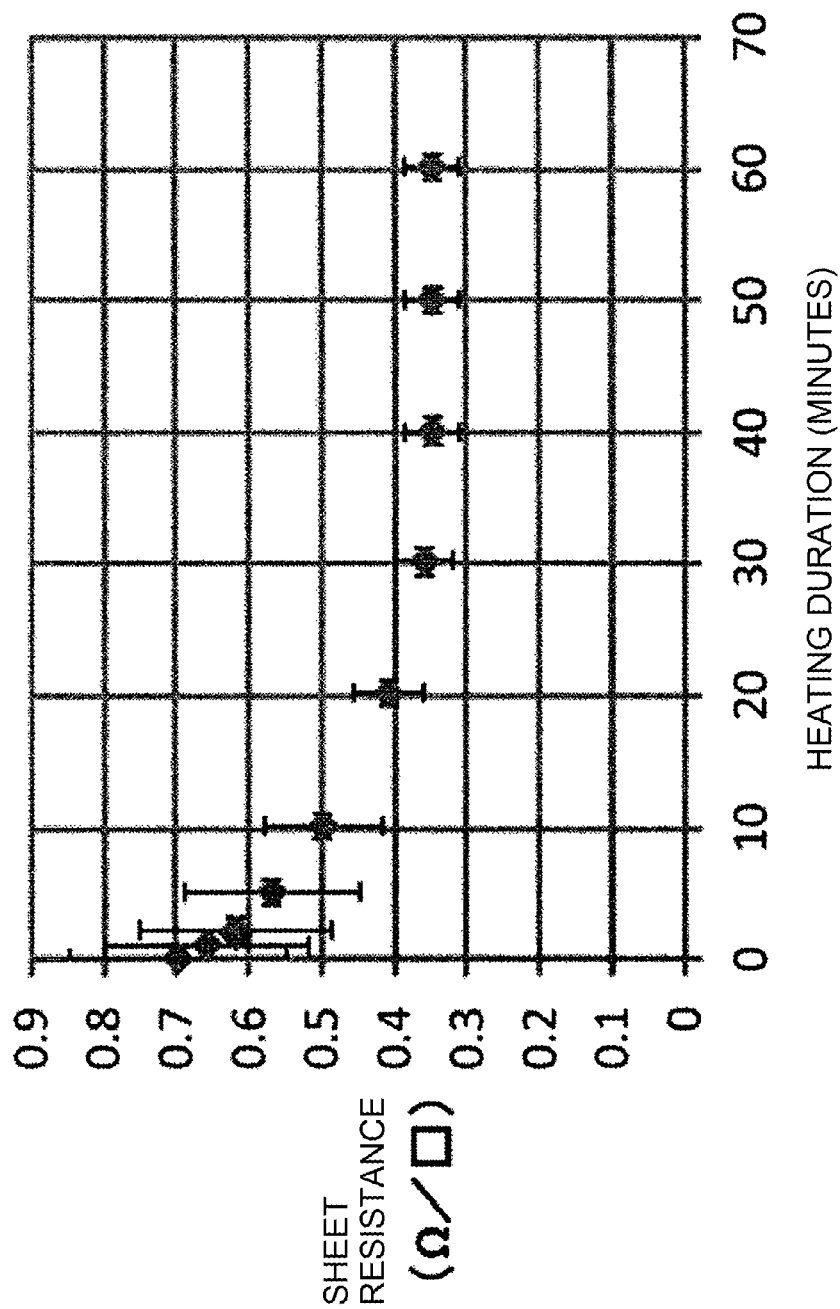
FIG. 10 is a diagram illustrating the relationship between the sheet resistance of the ohmic electrode and a heating duration at a heating temperature of 1100° C. in the invention.

The relationship between the sheet resistance of the ohmic electrodes and the heating duration at a heating temperature of 1100° C. illustrated in Table 2 is illustrated in FIG. 10. FIG. 10 is a diagram illustrating the relationship between the sheet resistance of the ohmic electrodes and the heating duration at a heating temperature of 1100° C. according to the invention. In FIG. 10, the horizontal axis indicates the heating duration (minutes). In FIG. 10, the length of a vertical bar indicates a variation in the sheet resistance. It is confirmed that, as the heating duration increases, the resistance value is reduced and the variation in the resistance value tended to be reduced. When the heating duration was equal to or more than 20 minutes, both the value of the sheet resistance and the variation in the sheet resistance are substantially constant.

As can be seen from FIG. 10, when the heating duration is equal to or more than 0 minute, the sheet resistance is equal to or less than 0.7 Ω/ and the variation in the sheet resistance is equal to or less than 0.15. As a result, excellent characteristics are obtained. When the heating duration is equal to or more than 1 minute, the sheet resistance is further reduced to 0.66 Ω/ or less and the variation in the sheet resistance is further reduced to 0.14 or less. When the heating duration is equal to or more than 2 minutes, the sheet resistance is further reduced to 0.62 Ω/ or less and the variation in the sheet resistance is further reduced to 0.13. When the heating duration is equal to or more than 5 minutes, when the heating duration is equal to or more than 10 minutes, and when the heating duration is equal to or more than 20 minutes, the sheet resistance and the variation in the sheet resistance are further reduced. However, even when the heating duration increases, the effect of the reduction is not particularly improved. Therefore, it is preferable that the upper limit of the heating duration be equal to or less than 120 minutes. The upper limit of the heating duration may be equal to or less than 30 minutes.

In addition, samples were manufactured at heating temperatures of 1100° C., 1150° C., 1200° C., 1250° C., 1300° C., 1350° C., 1400° C., 1450° C., and 1500° C. at the rates of temperature increase of 50° C./minute and 100° C./minute and the sheet resistance of the samples was measured. The same measurement results as those illustrated in FIG. 10 were obtained.

EXAMPLE 3

Figure 11:
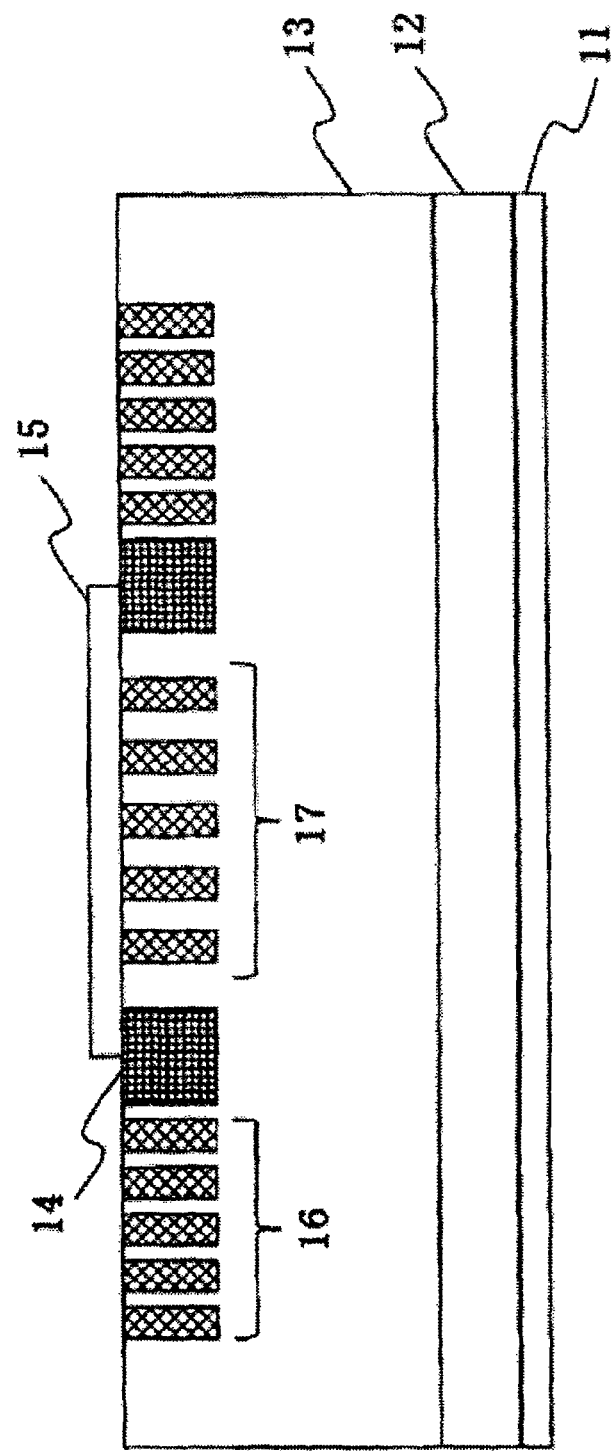
FIG. 11 is a cross-sectional view illustrating an SBD with a junction barrier Schottky (JBS) structure.

Next, Example 3 according to the invention will be described with reference to FIG. 11. FIG. 11 is a cross-sectional view illustrating a Schottky barrier diode (SBD) with a junction barrier Schottky (JBS) structure. Instead of the Schottky barrier diode according to Example 1, a Schottky barrier diode (SBD) with a junction barrier Schottky (JBS) structure 17 illustrated in FIG. 11 was manufactured by the same method as the Schottky barrier diode according to according to Example 1. The same effect as that in Example 1 was obtained under the same heating conditions as those in Example 1.

COMPARATIVE EXAMPLE

In this comparative example, a step of manufacturing a SiC semiconductor device without using the rear surface electrode forming method according to the invention will be described. First, an n-type region for a channel stopper, a p-type region for a termination structure, and a p-type region for a floating limiting ring (FLR) structure were formed on a SiC substrate, on which an epitaxial layer was formed, by ion implantation. Then, phosphorus which was implanted in order to form the n-type region for the channel stopper and aluminum which was implanted in order to form the p-type region for the termination structure and the p-type region for the FLR structure were activated in an argon atmosphere at a temperature of 1620° C. for 180 seconds. Then, a $SiO_2$ film with a thickness of 500 nm was formed on the front surface of the substrate by an atmospheric pressure CVD device. Then, a nickel layer with a thickness of 60 nm was formed on the rear surface of the substrate by a sputtering device. The substrate having the nickel layer formed thereon was heated to a temperature of 1000° C. at a rate of temperature increase of 1500° C./minute by RTA and a heating process was performed for two minutes to generate nickel silicide. Then, a rear surface electrode was formed by the same method as that used in Example 1. The obtained substrate was diced into chips and the electrical characteristics of the chip were evaluated. As a result, an on-voltage (VD was 1.41 V±0.242 V at room temperature.

As can be seen from the results obtained from Example 1 and the comparative example, in Example 1, the on-voltage (Vf) is 1.39 and is lower than 1.41 in the comparative example. In addition, in Example 1, a variation in the on-voltage is ±0.045 V and is one or more digits less than ±0.242 in the comparative example. Therefore, when the rear surface electrode structure for a SiC semiconductor device and the SiC semiconductor device manufacturing method according to the invention are used, it is possible to obtain a homogeneous SiC semiconductor device with sufficiently low rear surface contact resistance.

The above-described embodiment and examples are given for ease of understanding of the invention and the invention is not limited thereto. Various modifications and changes of the invention can be made without departing from the scope and spirit of the invention. The SiC semiconductor device according to the invention is not limited to the Schottky bather diode, but the invention can be applied to various semiconductor devices using SiC, such as MOSFETs. In addition, in the invention, the conductivity types (the n type and the p type) of the semiconductor layers or the semiconductor regions may be reversed. In this case, the same effect as described above is obtained.

Industrial Applicability

As described above, the SiC semiconductor device and the SiC semiconductor device manufacturing method according to the invention are useful for a vertical power semiconductor device including a rear surface electrode which has a low-resistance ohmic electrode on the rear surface side.

EXPLANATIONS OF LETTERS OR NUMERALS

1 SiC SUBSTRATE
2 GUARD RING
3 INSULATING LAYER
4 NICKEL SILICIDE LAYER INCLUDING TITANIUM CARBIDE
6 SCHOTTKY ELECTRODE
7 FRONT SURFACE ELECTRODE
8 REAR SURFACE ELECTRODE
11 OHMIC ELECTRODE
12 HIGH-CONCENTRATION n-TYPE SUBSTRATE
13 LOW-CONCENTRATION n-TYPE DRIFT LAYER

14 P-TYPE IMPURITY ION IMPLANTATION REGION
15 SCHOTTKY ELECTRODE
16 FLR STRUCTURE
17 JBS STRUCTURE

The invention claimed is:

1. A method for manufacturing a semiconductor device, comprising the steps of:
   forming an electrode structure on a SiC substrate, the forming of the electrode structure including
      depositing a composite layer that includes a nickel layer on the substrate and a titanium layer on the nickel layer;
      heating the composite layer to generate a nickel silicide layer that includes titanium carbide, the heating step being conducted during a heating period during which a rate of temperature increase is at least 10° C./minute but not more than 1350° C./minute and during which a maximum temperature that is higher than 1150° C. but not more than 1350° C. is achieved, the heating period having a duration of not more than 120 minutes; and
      forming a metal layer on the nickel silicide layer that includes titanium carbide.

2. The method for manufacturing a semiconductor device according to claim 1,
   wherein the semiconductor device has, as the electrode structure, a rear surface electrode structure including an ohmic electrode, which is the nickel silicide layer including titanium carbide, and a rear surface electrode, which is the metal layer, and a front surface electrode structure including a Schottky electrode and a front surface electrode.

3. The method for manufacturing a semiconductor device according to claim 1, wherein the electrode structure includes the nickel silicide layer that includes titanium carbide, a titanium layer, a nickel layer, and a gold layer which are laminated on the SiC semiconductor substrate in this order from a side adjacent to the SiC semiconductor substrate.

4. The method for manufacturing a semiconductor device according to claim 1,
   wherein the nickel silicide layer that includes titanium carbide includes a nickel silicide layer and a titanium carbide layer which are laminated in this order from a side close to the SiC semiconductor substrate.

5. The method of manufacturing a semiconductor device according to claim 1, wherein the rate of temperature increase in the heating step is at least 10° C./minute but not more than 100° C./minute.

6. A semiconductor device that is manufactured by the method of manufacturing a semiconductor device according to claim 1.

7. A semiconductor device that is manufactured by the method of manufacturing a semiconductor device according to claim 2.

8. A semiconductor device that is manufactured by the method of manufacturing a semiconductor device according to claim 3.

9. A semiconductor device that is manufactured by the method of manufacturing a semiconductor device according to claim 4.

* * * * *